US009875946B2

(12) United States Patent
Shchegrov et al.

(10) Patent No.: US 9,875,946 B2
(45) Date of Patent: Jan. 23, 2018

(54) ON-DEVICE METROLOGY

(71) Applicant: KLA-Tencor Corporation, Milpitas, CA (US)

(72) Inventors: Andrei V. Shchegrov, Campbell, CA (US); Jonathan M. Madsen, Los Altos, CA (US); Stilian Ivanov Pandev, Santa Clara, CA (US); Ady Levy, Sunnyvale, CA (US); Daniel Kandel, Aseret (IL); Michael E. Adel, Zichron Ya'akov (IL); Ori Tadmor, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 825 days.

(21) Appl. No.: 14/252,323

(22) Filed: Apr. 14, 2014

(65) Prior Publication Data
US 2014/0316730 A1 Oct. 23, 2014

Related U.S. Application Data

(60) Provisional application No. 61/814,191, filed on Apr. 19, 2013.

(51) Int. Cl.
*H01L 21/66* (2006.01)

(52) U.S. Cl.
CPC .............. *H01L 22/12* (2013.01); *H01L 22/20* (2013.01); *H01L 22/30* (2013.01); *H01L 2924/0002* (2013.01)

(58) Field of Classification Search
CPC ......... H01L 22/12; H01L 22/20; H01L 22/30; H01L 22/34; H01L 2924/00; H01L 2924/0002
See application file for complete search history.

(56) References Cited

U.S. PATENT DOCUMENTS 6,673,638 B1  1/2004 Bendik et al.
7,321,426 B1  1/2008 Poslaysky et al.
(Continued)

FOREIGN PATENT DOCUMENTS

TW  201241949 A1  10/2012
TW  201314174 A1  4/2013

OTHER PUBLICATIONS

Yu et al., True Process Variation Aware Optical Proximity Correction With Variational Lithography Modeling and Model Calibration, Jul.-Sep. 2007, J. Micro/Nanolith. MEMS MOEMS, vol. 6(3), 16 pp.*

(Continued)

*Primary Examiner* — Toan Le
(74) *Attorney, Agent, or Firm* — Spano Law Group; Joseph S. Spano

(57) ABSTRACT

Methods and systems for performing semiconductor metrology directly on device structures are presented. A measurement model is created based on measured training data collected from at least one device structure. The trained measurement model is used to calculate process parameter values, structure parameter values, or both, directly from measurement data collected from device structures of other wafers. In some examples, measurement data from multiple targets is collected for model building, training, and measurement. In some examples, the use of measurement data associated with multiple targets eliminates, or significantly reduces, the effect of under layers in the measurement result, and enables more accurate measurements. Measurement data collected for model building, training, and measurement may be derived from measurements performed by a combination of multiple, different measurement techniques.

16 Claims, 13 Drawing Sheets

(56) References Cited

U.S. PATENT DOCUMENTS

| | | |
|---|---|---|
| 7,564,557 B2 | 7/2009 | Mieher et al. |
| 8,142,966 B2 | 3/2012 | Izikson et al. |
| 8,193,007 B1 | 6/2012 | Madriaga et al. |
| 9,310,296 B2 | 4/2016 | Dziura et al. |
| 2006/0167651 A1 | 7/2006 | Zangooie et al. |
| 2007/0135959 A1 | 6/2007 | Vuong et al. |
| 2008/0183442 A1 | 7/2008 | Loo et al. |
| 2013/0110477 A1 | 5/2013 | Pandev |
| 2013/0262044 A1 | 10/2013 | Pandev et al. |
| 2013/0305206 A1 | 11/2013 | Pandev |

OTHER PUBLICATIONS

International Search Report and Written Opinion dated Aug. 11, 2014, for PCT Application No. PCT/US2014/034668 filed Apr. 18, 2014, by KLA-Tencor Corporation, 10 pages.

Inventor(s): Kevin Lensing et al. Title: Lithography Process Control Using Scatterometry Metrology and Semi-Physical Modeling Proc. of SPIE vol. 6518, 651804, pp. 1-12, (2007).

Inventor(s): Michael L. Rieger Title: Communication Theory in Optical Lithography Journal of Micro/Nanolithography, MEMS, and MOEMS vol. 11, Issue 1, 013003, pp. 1-11 (2012).

* cited by examiner

ON-DEVICE METROLOGY

CROSS REFERENCE TO RELATED APPLICATION

The present application for patent claims priority under 35 U.S.C. §119 from U.S. provisional patent application Ser. No. 61/814,191, entitled "On-Device Metrology," filed Apr. 19, 2013, the subject matter of which is incorporated herein by reference in its entirety.

TECHNICAL FIELD

The described embodiments relate to metrology systems and methods, and more particularly to methods and systems for improved parameter measurement.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput measurement without the risk of sample destruction. A number of optical metrology based techniques including scatterometry and reflectometry implementations and associated analysis algorithms are commonly used to characterize critical dimensions, film thicknesses, composition and other parameters of nanoscale structures.

Traditionally, optical metrology is performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

For example, modern memory structures are often high-aspect ratio, three-dimensional structures that make it difficult for optical radiation to penetrate to the bottom layers. In addition, the increasing number of parameters required to characterize complex structures (e.g., FinFETs), leads to increasing parameter correlation. As a result, the measurement model parameters characterizing the target often cannot be reliably decoupled.

In response to these challenges, more complex optical tools have been developed. Measurements are performed over a large ranges of several machine parameters (e.g., wavelength, azimuth and angle of incidence, etc.), and often simultaneously. As a result, the measurement time, computation time, and the overall time to generate reliable results, including measurement recipes, increases significantly. In addition, the spreading of light intensity over large wavelength ranges decreases illumination intensity at any particular wavelength and increases signal uncertainty of measurements performed at that wavelength.

In addition, existing model based metrology methods typically include a series of steps to model and then measure structure parameters. Typically measurement data is collected (e.g., DOE spectra) from a particular metrology target. An accurate model of the optical system, dispersion parameters, and geometric features is formulated. Film spectra measurements are collected to determine material dispersions. A parametric geometric model of the target structure is created along with an optical model. In addition, simulation approximations (e.g., slabbing, Rigorous Coupled Wave Analysis (RCWA), etc.) must be carefully performed to avoid introducing excessively large errors. Discretization and RCWA parameters are defined. A series of simulations, analysis, and regressions are performed to refine the geometric model and determine which model parameters to float. A library of synthetic spectra is generated. Finally, measurements are performed using the library and the geometric model. Each step introduces errors and consumes a significant amount of computational and user time. Typically, a model building task requires days, or even weeks, to complete. In addition, the size of the library and the computation time associated with performing regression calculations during measurement reduces the throughput of the measurement system.

In addition, conventional metrology techniques rely on dedicated metrology structures or targets. In semiconductor manufacture, and patterning processes in particular, process control is enabled by performing metrology on specific dedicated structures. These dedicated structures may be located in the scribe lines between dies, or within the die itself. The use of dedicated metrology structures may introduce significant measurement errors. Discrepancies between actual device structures and dedicated metrology targets limit the ability of metrology data to accurately reflect the status of the actual device features in the die. In one example, discrepancies arise due to location dependent differences in process loading, pattern density, or aberration fields because the dedicated metrology targets and actual device structures are not collocated. In another example, the characteristic feature sizes of the dedicated metrology structures and the actual device structure are often quite different. Hence, even if the dedicated metrology target and the actual device structure are in close proximity, discrepancies result from differences in size. Furthermore, dedicated metrology structures require space in the device layout. When sampling density requirements are high, dedicated metrology structures crowd out actual device structures.

Future metrology applications present challenges for metrology due to increasingly small resolution requirements, multi-parameter correlation, increasingly complex geometric structures, and increasing use of opaque materials. Thus, methods and systems for improved measurements are desired.

SUMMARY

Methods and systems for performing semiconductor metrology directly on device structures are presented. A measurement model is created based on measured training data collected from at least one device structure. The trained measurement model is used to calculate process parameter values, structure parameter values, or both, directly from measurement data collected from device structures of other wafers.

In one aspect, a measurement model is created based only on measured training data (e.g., spectra collected from a Design of Experiments (DOE) wafer) collected from at least one actual device structure. The trained measurement model is then used to calculate process parameter values, structure parameter values, or both, directly from measured data (e.g., spectra) collected from actual device structures of other wafers.

The measurement models described herein receive measurement data directly as input and provide process parameter values, structure parameter values, or both, as output. By streamlining the modeling process, predictive results are improved along with a reduction in computation and user time.

By way of non-limiting example, the methods and systems of on-device metrology described herein are applied to overlay metrology, CD metrology, film metrology, composition metrology, focus and dose metrology, and on-device navigation.

In one further aspect, measurement data from both on-device measurement targets and assist targets that may be found on-device or within scribe lines is collected for model building, training, and measurement. In some examples, the use of measurement data associated with multiple targets eliminates, or significantly reduces, the effect of under layers in the measurement result. The use of measurement data associated with multiple targets increases the sample and process information embedded in the model. In particular, the use of training data that includes measurements of multiple, different targets at one or more measurement sites enables more accurate measurements.

In yet another aspect, measurement data is collected and analyzed to determine the location of a desired metrology target on a wafer surface.

In yet another aspect, measurement data derived from measurements performed by a combination of multiple, different measurement techniques is collected for model building, training, and measurement. The use of measurement data associated with multiple, different measurement techniques increases the sample and process information embedded in the model and enables more accurate measurements. In general, any measurement technique, or combination of two or more measurement techniques may be contemplated.

In yet another aspect, the measurement model results described herein can be used to provide active feedback to a process tool (e.g., lithography tool, etch tool, deposition tool, etc.).

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
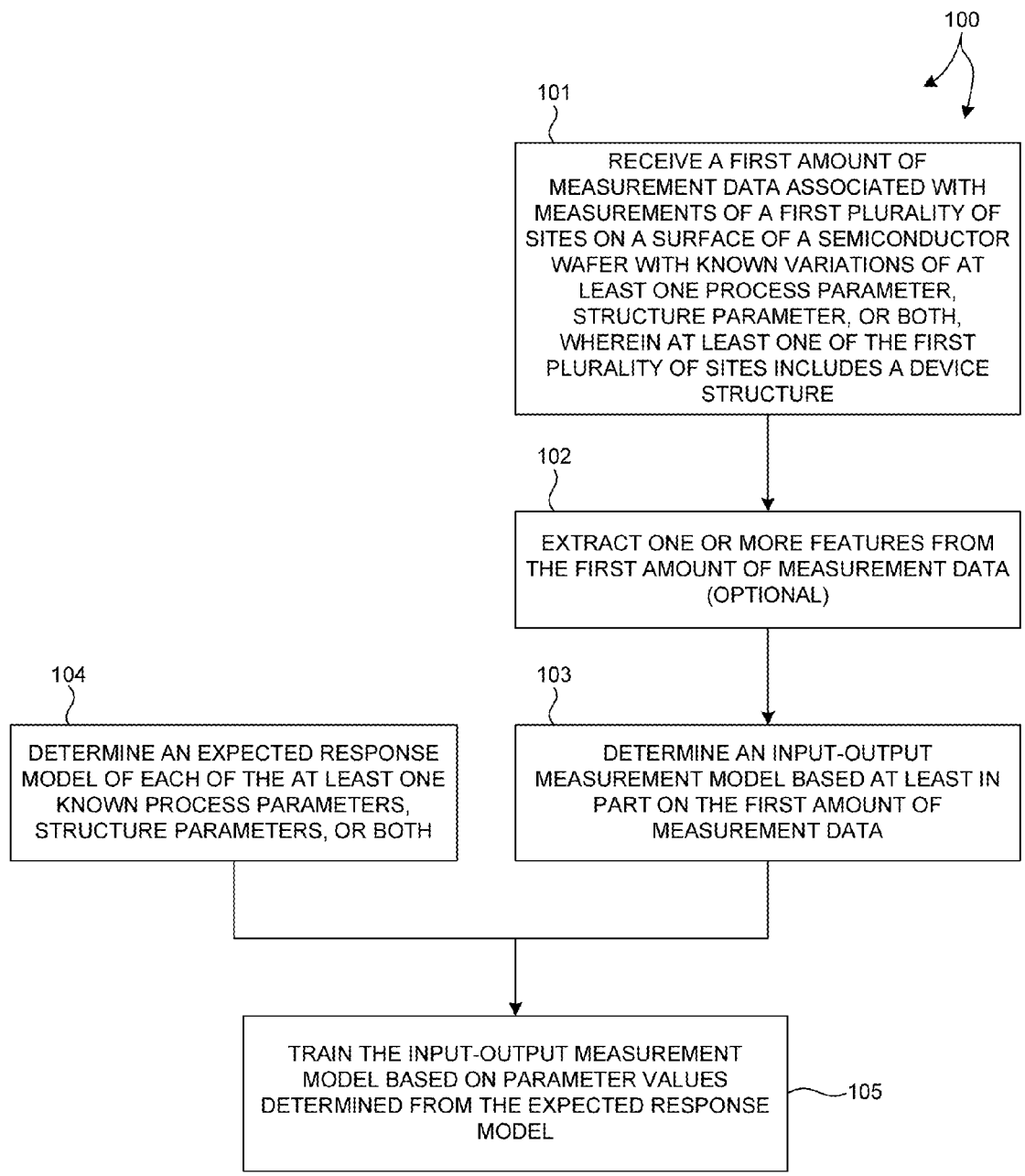
FIG. 1 is a flowchart illustrative of a method 100 of building and training a measurement model as described herein.

Reference will now be made in detail to background examples and some embodiments of the invention, examples of which are illustrated in the accompanying drawings.

Methods and systems for performing semiconductor metrology directly on the actual device structure are presented.

In one aspect, a measurement model is created based only on measured training data (e.g., spectra collected from a Design of Experiments (DOE) wafer) collected from at least one actual device structure. The trained measurement model is then used to calculate process parameter values, structure parameter values, or both, directly from measured data (e.g., spectra) collected from actual device structures of other wafers. In this manner, only spectra acquired from samples is required to create a measurement model and to perform measurements using the model.

The measurement models described herein receive measurement data (e.g., measured spectra) directly as input and provide process parameter values, structure parameter values, or both, as output. By streamlining the modeling process, the predictive results are improved along with a reduction in computation and user time.

In a further aspect, process parameters are directly measured based on the measurement model created from raw measurement data (e.g., spectra) collected from at least one actual device structure as described herein. Thus, a separate model to derive process parameters from geometric parameters is not required. Because process variation is captured by the model, process parameter values are measured even when the underlying structure topology is changing due to process variations. This is impossible, or very difficult to model using existing model based metrology methods.

Although methods and systems for performing semiconductor metrology directly on the actual device structure are presented, these methods and systems may also involve measurements of dedicated metrology targets (e.g., proxy structures) located in-die or within scribe lines.

Traditionally, model-based semiconductor metrology consists of formulating a metrology model that attempts to predict the measured optical signals based on a model of the interaction of the measurement target with the particular metrology system. The target-specific model includes a parameterization of the structure in terms of the physical properties of the measurement target of interest (e.g., film thicknesses, critical dimensions, refractive indices, grating pitch, etc.). In addition, the model includes a parameterization of the measurement tool itself (e.g., wavelengths, angles of incidence, polarization angles, etc.).

Machine parameters ($P_{machine}$) are parameters used to characterize the metrology tool itself. Exemplary machine parameters include angle of incidence (AOI), analyzer angle ($A_0$), polarizer angle ($P_0$), illumination wavelength, numerical aperture (NA), etc. Specimen parameters ($P_{specimen}$) are parameters used to characterize the geometric and material properties of the specimen. For a thin film specimen, exemplary specimen parameters include refractive index, dielectric function tensor, nominal layer thickness of all layers, layer sequence, etc.

For measurement purposes, the machine parameters are treated as known, fixed parameters and the specimen parameters, or a subset of specimen parameters, are treated as unknown, floating parameters. The floating parameters are resolved by a fitting process (e.g., regression, library matching, etc.) that produces the best fit between theoretical predictions and measured data. The unknown specimen parameters, $P_{specimen}$, are varied and the model output values are calculated until a set of specimen parameter values are determined that results in a close match between the model output values and the measured values.

In many cases, the specimen parameters are highly correlated. This can lead to instability of the metrology-based target model. In some cases, this is resolved by fixing certain specimen parameters. However, this often results in significant errors in the estimation of the remaining parameters. For example, underlying layers (e.g., oxide base layers of a semiconductor material stack on a semiconductor wafer) are not uniformly thick over the surface of a wafer. However, to reduce parameter correlation, measurement models are constructed that treat these layers as having a fixed thickness over the surface of the wafer. Unfortunately, this may lead to significant errors in the estimation of other parameters.

By using raw measurement data (e.g., spectra) only to create the model of process parameters, geometric parameters, or both, as described herein, the errors and approximations associated with traditional model based metrology methods are reduced. Measurement of complex three dimensional structures and in-die measurements are enabled without the complexity added by geometric models and simulations. In some examples, the model can be created in less than an hour. In addition, by employing a simplified model, measurement time is reduced compared to existing model based metrology methods. In some examples, measurement time is less than ten milliseconds per measurement site. In contrast, measurement times using traditional model based metrology methods can be greater than one second in some cases.

Figure 12:
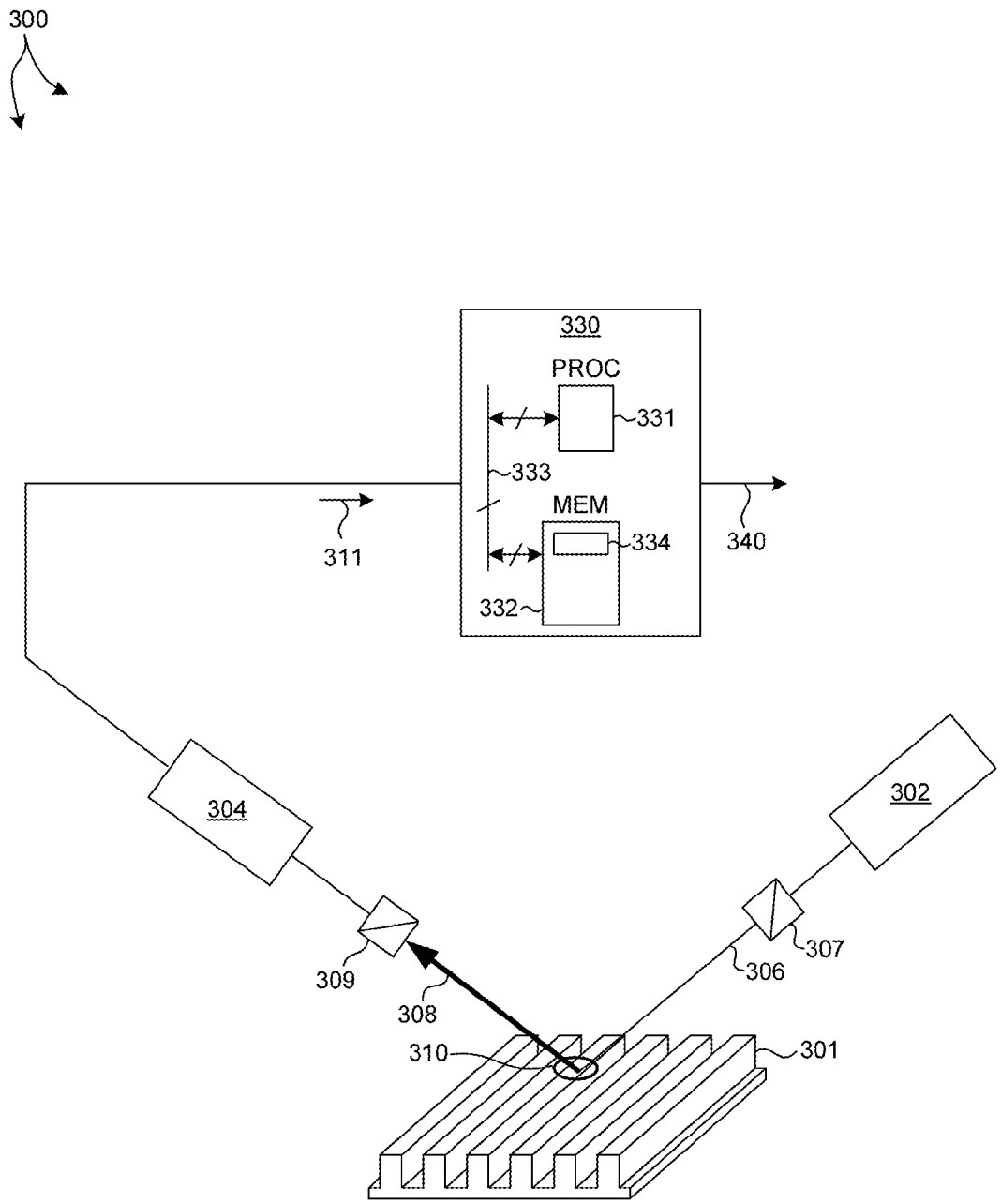
FIG. 12 illustrates a system 300 for measuring characteristics of a specimen in accordance with the exemplary methods presented herein.

FIG. 1 illustrates a method 100 suitable for implementation by a metrology system such as metrology system 300 illustrated in FIG. 12 of the present invention. In one aspect, it is recognized that data processing blocks of method 100 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 101, a first amount of measurement data associated with measurements of a first plurality of sites on a surface of a semiconductor wafer is received by a computing system (e.g., computing system 330). The measured sites exhibit known variations of at least one process parameter, structure parameter, or both.

In some embodiments, process parameter variations are organized in a Design of Experiments (DOE) pattern on the surface of a semiconductor wafer (e.g., DOE wafer). In this manner, the measurement sites interrogate different locations on the wafer surface that correspond with different process parameter values. In one example, the DOE pattern is a Focus/Exposure Matrix (FEM) pattern. Typically, a DOE wafer exhibiting a FEM pattern includes a grid pattern of measurement sites. In one grid direction (e.g., the x-direction), the exposure dosage is varied while the depth of focus is held constant. In the orthogonal grid direction (e.g., the y-direction), the depth of focus is varied while the exposure dosage is held constant. In this manner, measurement data collected from the DOE wafer includes data associated with known variations in the focus and dosage process parameters.

In the aforementioned example, the measurement data is associated with a DOE wafer processed with known variations in focus and exposure. However, in general, measurement data associated with any known variation of process parameters, structural parameter, or both, may be contemplated.

In one aspect, the first amount of measurement data includes measurement data associated with measurements at a site on the surface of the semiconductor wafer that includes a device structure. In other words, at least some of the measurement data includes on-device measurements. In one example, the measurement data includes two ellipsometric parameters ($\Psi,\Delta$) over a spectral range obtained at an on-device location at a specified stage in manufacturing, or a multitude of manufacturing stages.

For purposes of model training, additional measurement data may be acquired from other locations with known perturbations in the design parameters, e.g., structure or process parameters. These locations, for example, may be in the scribe line, or may be at other locations on the wafer where, for example, lithographic exposure conditions or reticle design characteristics vary over a range of values. In another example, measurement data may be acquired from different device locations (e.g., a location with dense features and a location with isolated features, or locations with two different CDs on mask). In general, the measurement data is acquired from different locations that are perturbed in a known way. The perturbation may be known from mask data, Equipment Data Acquisition (EDA) data, process data, etc.

The set of systematic variations is commonly termed a design of experiments (DOE). In one example, any of focus, exposure, and overlay are varied systematically across the device or the wafer. In another example, a randomized Focus and Exposure Matrix (FEM) is employed to reduce correlation with underlayer parameters as described in U.S. Pat. No. 8,142,966 to Izikson et al., the entirety of which is incorporated herein by reference.

In a preferred embodiment, the set of systematic variations is implemented in the fabrication of an actual DOE wafer. The DOE wafer is subsequently measured to generate the measurement data received in block 101. A manufactured wafer includes systematic errors which cannot be easily modeled by simulation. For example, the effect of underlayers is more accurately captured by measurements of a real wafer. The underlayer contribution can be decorrelated from the measurement responses by modifying process parameters during manufacture, e.g., focus and exposure variations, for a fixed underlayer condition. In another example, the underlayer contribution can be mitigated by taking multiple data sets from features with varying top layer topography and constant underlayer conditions. In one example, the top layer may include a periodic structure and the underlayer may be non-periodic.

Measurement locations may be selected to increase measurement sensitivity. In one example, measurements performed at line ends are most sensitive to changes in focus. In general, measurements should be taken at on-device structures that are most sensitive to changes in the parameter to be measured.

Although it is preferred to perform actual measurements of DOE wafers, in some other examples the measurement response of a DOE wafer may be simulated. In these examples, the measurement data received in block 101 is synthetically generated.

In block 102, one or more features are extracted from the first amount of measurement data. In some examples, the measurement data is analyzed using Principal Components Analysis (PCA), or non-linear PCA, to extract features that most strongly reflect the variations in process parameter, structural parameters, or both, that are present at the different measurement sites. In some other examples, a signal filtering technique may be applied to extract signal data that most strongly reflects the parameter variations present at the different measurement sites. In some other examples, individual signals that most strongly reflect the parameter variations present at the different measurement sites may be selected from multiple signals present in the measurement data. Although, it is preferred to extract features from the measurement data to reduce the dimension of data subject to subsequent analysis, it is not strictly necessary. In this sense, block 102 is optional.

In block 103, an input-output measurement model is determined based on features extracted from the measurement data, or alternatively, directly from the measurement data. The input-output measurement model is structured to receive measurement data generated by a metrology system at one or more measurement sites, and directly determine process parameter values, structural parameter values, or both, associated with each measurement target. In a preferred embodiment, the input-output measurement model is implemented as a neural network model. In one example, the number of nodes of the neural network is selected based on the features extracted from the measurement data. In other examples, the input-output measurement model may be implemented as a polynomial model, a response surface model, or other types of models.

In block 104, an expected response model is generated for each of the parameters that are known to be varying across the measurement sites where the measurement data is collected. In general, the expected response model defines the values of the known, varying parameters as a function of location on the wafer surface. In this manner, the expected response model defines the expected overall shape of the wafer map for a given parameter.

In block 105, the input-output measurement model is trained based on parameter values determined from the expected response model. In this manner, process information embedded in the expected response model is used to constrain the input-output model within the process space. In this manner, the trained input-output measurement model is generated using DOE measurement data and an expected response model. The model is trained such that its output fits the defined expected response for all the spectra in the process variation space defined by the DOE spectra.

In some examples, one or more process parameters are to be measured. In these examples, the expected response model is based on the known process parameter values associated with the measured DOE wafer.

Figure 2:
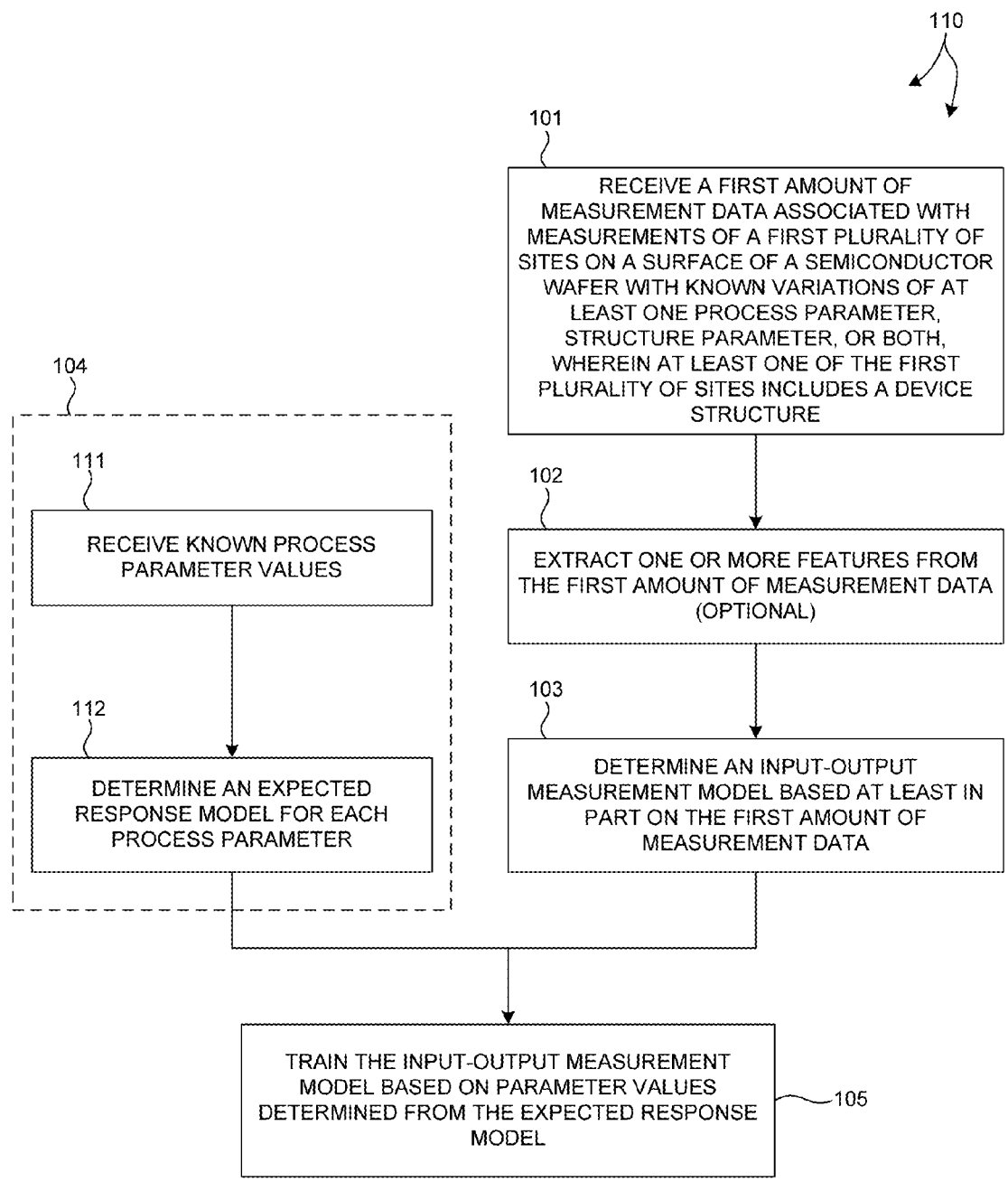
FIG. 2 is a flowchart illustrative of a method 110 of building and training a measurement model in another example as described herein.

FIG. 2 illustrates a method 110 suitable for implementation by a metrology system such as metrology system 300 illustrated in FIG. 12 of the present invention in another example. Method 110 includes like numbered blocks as described with reference to FIG. 1. As depicted in FIG. 2, in block 111, known process parameter values are received by a computing system such as computing system 330. In some examples, the known process parameter values are the depth of focus and exposure dose of a lithography system used to manufacture the DOE wafer.

In block 112, computing system 330 determines an expected response model for each process parameter. In a typical DOE wafer, the focus and exposure are changed linearly in accordance with the x and y coordinates of the DOE wafer. In some examples, the expected response shape for a focus parameter on a DOE wafer is a tilted plane in the x-direction with a zero crossing in the middle of the wafer. In one example, the expected response function that determines the focus parameter value is, focus=a*x+b, where a and b are coefficients that realize the best fit to the known focus parameter values at each measurement site. Similarly, the expected response shape for an exposure parameter on a DOE wafer is a tilted plane in the y-direction with a zero crossing in the middle of the wafer. In another example, the expected response function that determines the exposure parameter value is, exposure=c*y+d, where c and d are coefficients that realize the best fit to the known exposure parameter values at each measurement site.

In another example, the expected response model of the DOE wafer is determined by fitting a two dimensional map function (i.e., {x,y}) to the known values of focus and exposure at each of the measurement sites.

Figure 3:
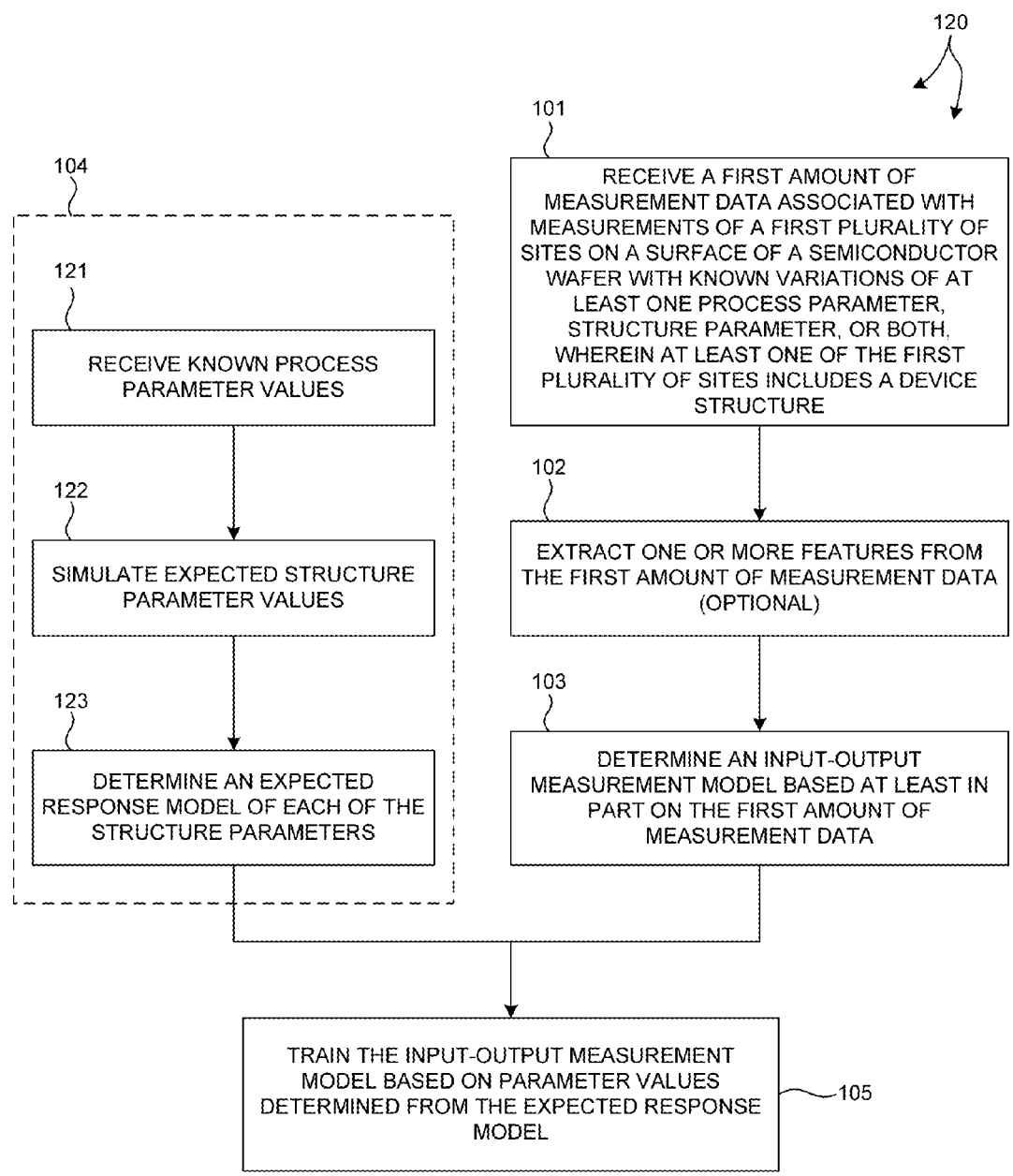
FIG. 3 is a flowchart illustrative of a method 120 of building and training a measurement model in yet another example as described herein.

In some other examples, one or more structural parameters are to be measured. For a geometric parameter the shape of the wafer map may be more complex, and often the shape is defined by the process. In some of these examples, the expected response model is generated based on the known process parameter values associated with the measured DOE wafer. FIG. 3 illustrates a method 120 suitable for implementation by a metrology system such as metrology system 300 illustrated in FIG. 12 of the present invention in yet another example. Method 120 includes like numbered blocks as described with reference to FIG. 1.

As depicted in FIG. 3, in block 121, known process parameter values are received by a computing system such as computing system 330. In one example, the known process parameter values are the known focus and exposure values corresponding with each measurement site.

In block 122, computing system 330 determines the expected structural parameter values associated with each of the known process parameter values at each measurement site are determined based on a simulation. For example, a process simulator is employed to define the expected response of a structural parameter (i.e., a geometric or material parameter) for a given set of process parameter values. An exemplary process simulator includes the Positive Resist Optical Lithography (PROLITH) simulation software available from KLA-Tencor Corporation, Milpitas, Calif. (USA). Although this exemplary lithography process model is generated using PROLITH software, in general, any process modeling technique or tool may be contemplated within the scope of this patent document (e.g., Coventor simulation software available from Coventor, Inc., Cary, N.C., USA). In some examples, the expected structural parameter values at each measurement site are determined based on the corresponding focus and exposure parameter values corresponding with each measurement site.

In block 123, computing system 330 determines the expected response model of each structural parameter. In some examples, the expected response model is determined by fitting a two dimensional (e.g., {x,y}) map function to the structural parameter values associated with each measurement site.

Figure 4:
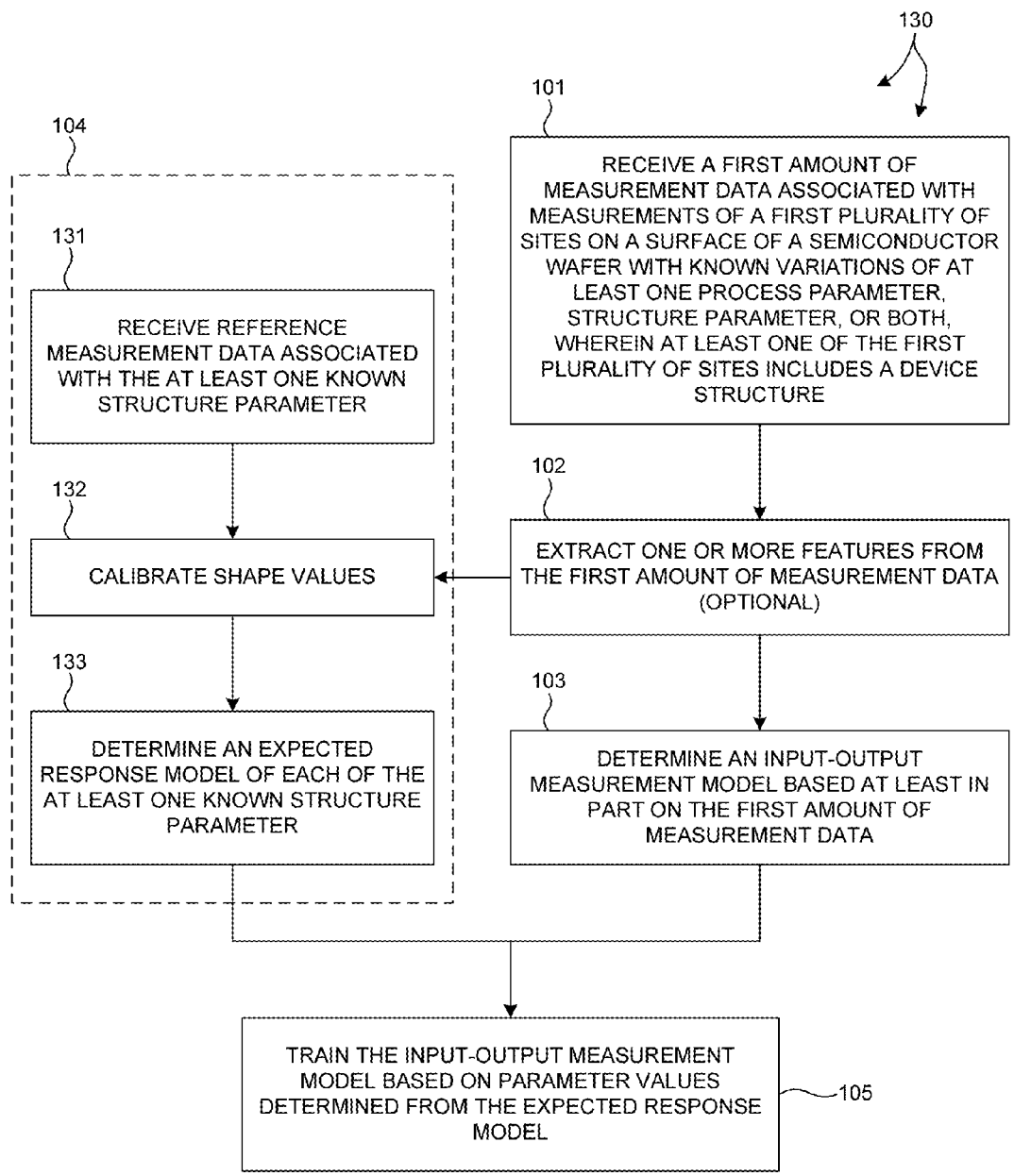
FIG. 4 is a flowchart illustrative of a method 130 of building and training a measurement model in yet another example as described herein.

In some other examples, the expected response model for a structural parameter is determined based on features of the measurement data associated with the DOE wafer. FIG. 4 illustrates a method 130 suitable for implementation by a metrology system such as metrology system 300 illustrated in FIG. 12 of the present invention in yet another example. Method 130 includes like numbered blocks as described with reference to FIG. 1.

As depicted in FIG. 4, in block 131, reference measurement data associated with measurements of the structural parameter on the DOE wafer are received, for example, by computing system 330. The reference measurement data is derived from measurements of targets at one or more measurement sites of the DOE wafer by a reference metrology system such as a Scanning Electron Microscope (SEM), Tunneling electron Microscope (TEM), Atomic Force Microscope (AFM), or x-ray measurement system.

In addition, in block 102, one or more features (e.g., shape functions) are extracted from the measurement data as described with reference to FIG. 1. In one example, the first principal component (PC1) of the measured spectra is used to describe the overall shape of the response surface associated with a particular structural parameter (e.g., Middle Critical Dimension (MCD)).

In block 132, computing system 330 calibrates the shape function(s) extracted from the measurement data based on the reference measurement data to generate a calibrated response surface.

In block 133, computing system 330 determines the expected response model of each of the known structural parameters by fitting a two dimensional (e.g., {x,y}) map function to the calibrated response surface. In one example, the expected response model of the MCD parameter is: $MCD = a_{01} + a_{11}(y + r_0 y^2) + a_{21} x^2$, where x and y are the wafer coordinates and a01, a11, r0, a21 are coefficients that best fit the function to the calibrated shape function.

Figure 5:
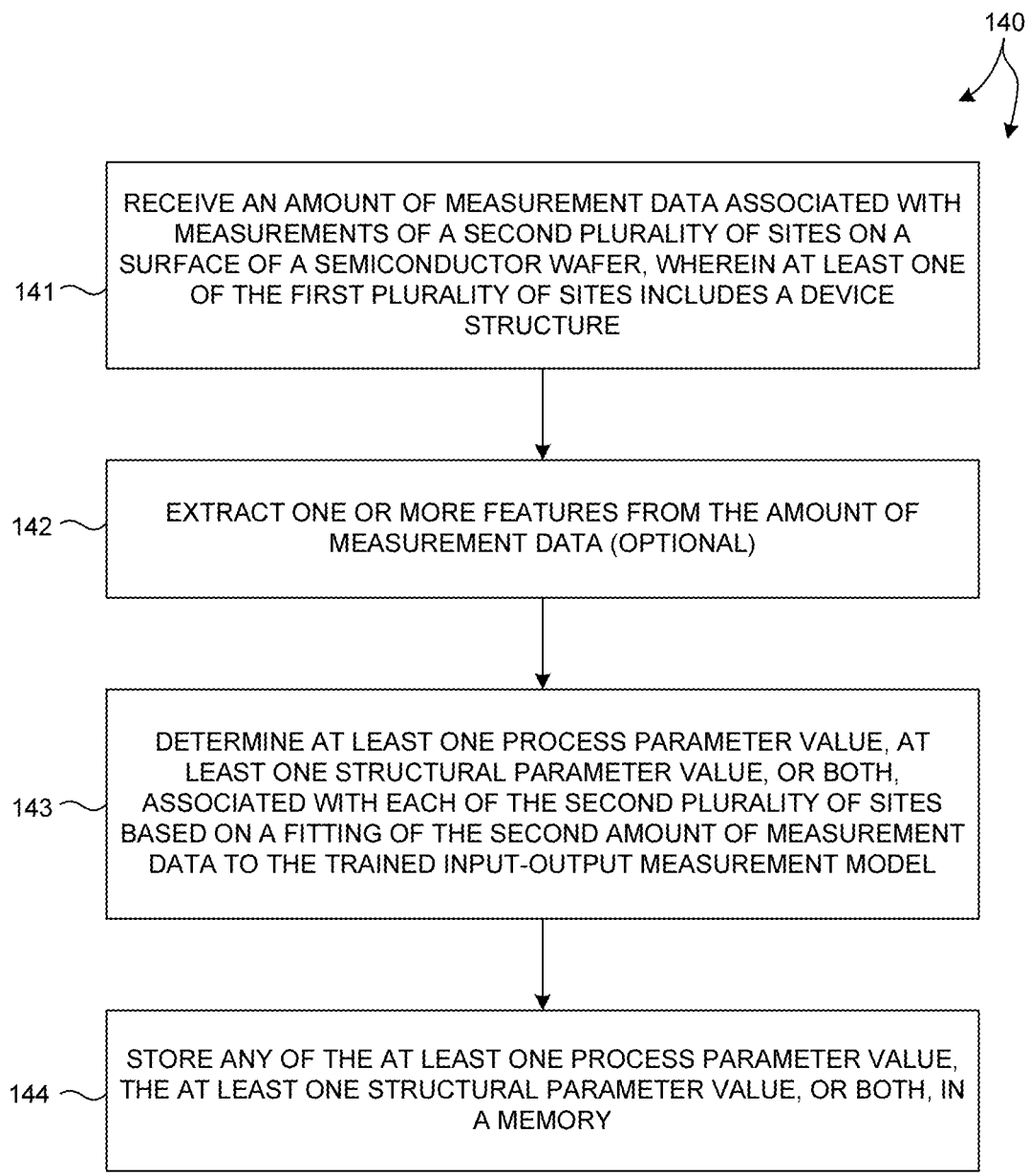
FIG. 5 is a flowchart illustrative of a method 140 of measuring process parameters, structural parameters, or both, of a semiconductor wafer using a measurement model generated by any of methods 100, 110, 120, and 130.

In another aspect, the trained model is employed as the measurement model for measurement of other wafers. FIG. 5 illustrates a method 140 suitable for implementation by a metrology system such as metrology system 300 illustrated in FIG. 12 of the present invention. In one aspect, it is recognized that data processing blocks of method 140 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 141, an amount of measurement data associated with measurements of a second plurality of sites on a surface of a semiconductor wafer is received by a computing system (e.g., computing system 330).

In block 142, one or more features are extracted from the measurement data. In some examples, the measurement data is analyzed using Principal Components Analysis (PCA), or non-linear PCA, to extract features that most strongly reflect the variations in process parameter, structural parameters, or both, that are present at the different measurement sites. In some other examples, a signal filtering technique may be applied to extract signal data that most strongly reflects the parameter variations present at the different measurement sites. In some other examples, individual signals that most strongly reflect the parameter variations present at the different measurement sites may be selected from multiple signals present in the measurement data. Although, it is preferred to extract features from the measurement data to reduce the dimension of data subject to subsequent analysis, it is not strictly necessary. In this sense, block 142 is optional. In addition, it is preferred to extract features from the measurement data using the same analysis employed to extract features from the training data in block 102, as described with reference to FIGS. 1-4.

In block 143, at least one process parameter value, at least one structural parameter value, or both, associated with each of the second plurality of sites is determined by computing system 330 based on a fitting of the second amount of measurement data to the trained input-output measurement model as described with reference to FIGS. 1-4, by way of non-limiting example.

In block 144, the determined parameter values are stored in a memory. For example, the parameter values may be stored on-board the measurement system 300, for example, in memory 332, or may be communicated (e.g., via output signal 340) to an external memory device.

Figure 6A:
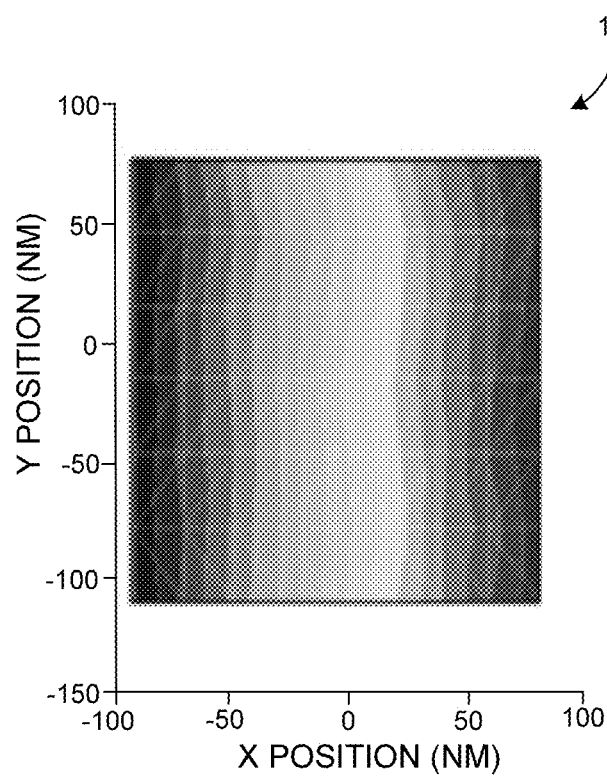
FIGS. 6A-6B are contour plots illustrative of measurements of exposure dosage and depth of focus, respectively, of a FEM wafer.
Figure 6B:
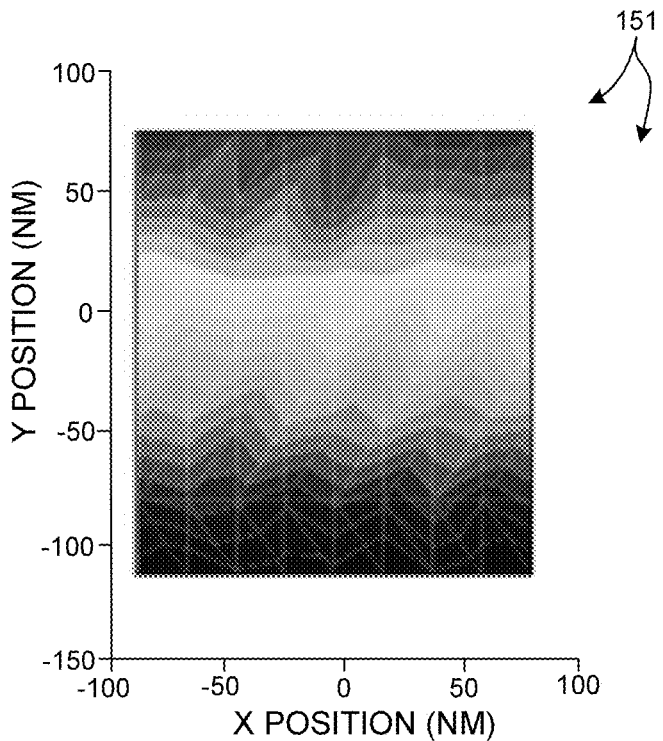

FIG. 6A is a contour plot 150 illustrative of measurements of exposure dosage across the surface of a DOE wafer. As illustrated, exposure dosage varies in the x-direction across the wafer and is constant in the y-direction across the wafer. FIG. 6B is a contour plot 151 illustrative of measurements of lithography depth of focus across the surface of a DOE wafer. As illustrated, depth of focus varies in the y-direction across the wafer and is constant in the x-direction across the wafer.

The measurement results illustrated in FIGS. 6A and 6B result from measurements (i.e., measured spectra) collected at multiple measurement sites on a DOE wafer and processed in accordance with method 140 illustrated in FIG. 5. The underlying dosage and focus measurement models were developed in accordance with method 110 and trained with measurement data collected from different measurement sites on the same DOE wafer.

Figure 6C:
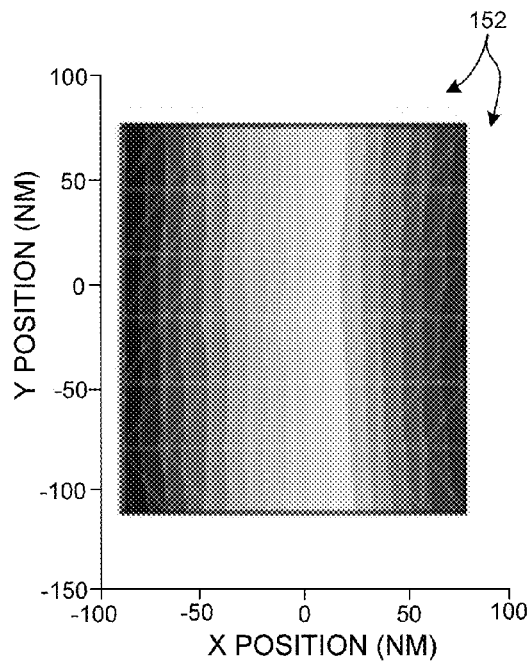
FIGS. 6C-6D are contour plots illustrative of measurements of exposure dosage and depth of focus, respectively, of a sample wafer.
Figure 6D:
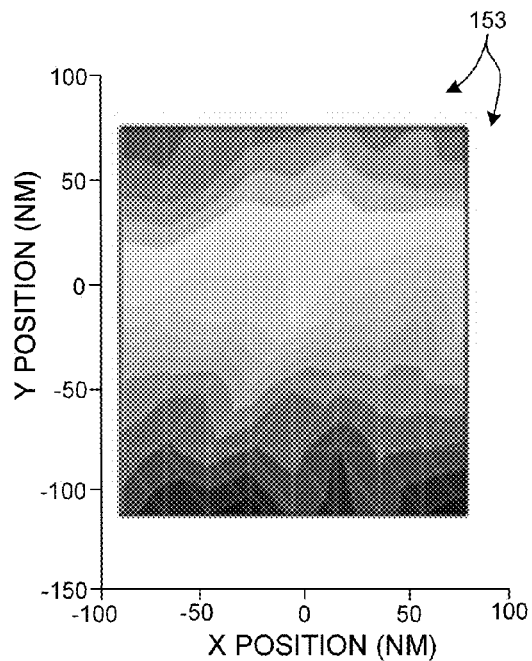

FIG. 6C is a contour plot 152 illustrative of measurements of exposure dosage across the surface of a sample wafer. FIG. 6D is a contour plot 153 illustrative of measurements of lithography depth of focus across the surface of the same wafer described with reference to FIG. 6C.

The measurement results illustrated in FIGS. 6C and 6D are each derived from measurements (i.e., measured spectra) collected at multiple measurement sites on a wafer, different from the DOE wafer, and processed in accordance with method 140 illustrated in FIG. 5. The underlying dosage and focus measurement models were developed in accordance with method 110 and trained with measurement data collected from different measurement sites on the DOE wafer described with reference to FIGS. 6A and 6B.

Figure 6E:
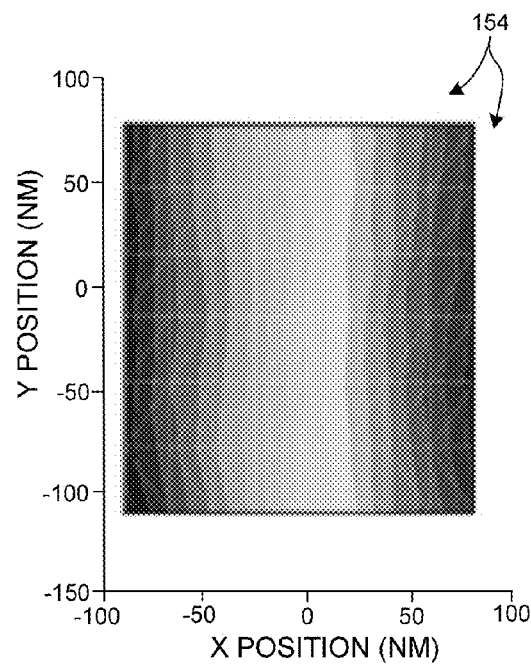
FIGS. 6E-6F are contour plots illustrative of measurements of exposure dosage and depth of focus, respectively, of another sample wafer.
Figure 6F:
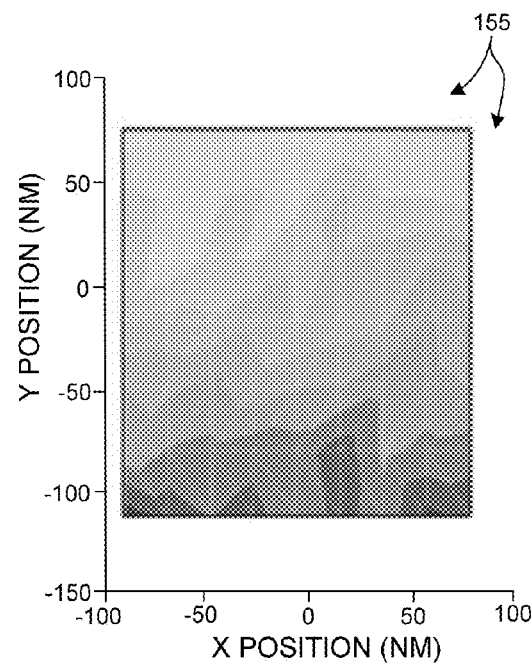

FIG. 6E is a contour plot 154 illustrative of measurements of exposure dosage across the surface of yet another sample wafer. FIG. 6F is a contour plot 155 illustrative of measurements of lithography depth of focus across the surface of the same wafer described with reference to FIG. 6E.

The measurement results illustrated in FIGS. 6E and 6F are derived from measurements (i.e., measured spectra) collected at multiple measurement sites on the sample wafer that is different from the DOE wafer, and processed in accordance with method 140 illustrated in FIG. 5. The underlying dosage and focus measurement models were developed in accordance with method 110 and trained with measurement data collected from different measurement sites on the DOE wafer described with reference to FIGS. 6A and 6B. As illustrated in FIGS. 6C-6F, variations in the value of focus and exposure across different wafers having different focus steps are captured by the measurement model developed in accordance with method 110.

Figure 7A:
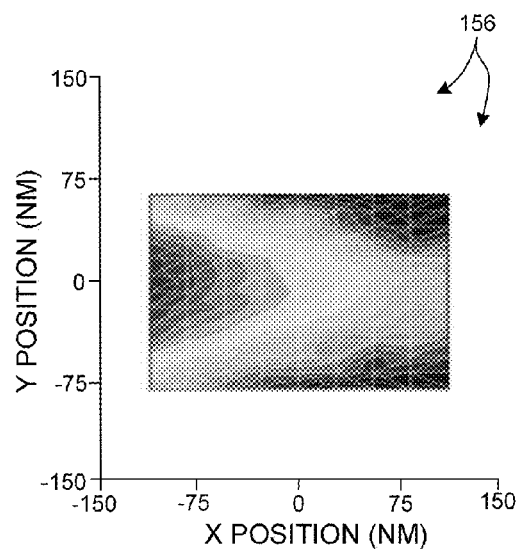
FIGS. 7A-7B are contour plots illustrative of measurements of middle critical dimension (MCD) of isolated structures and dense structures, respectively, across the surface of a focus exposure matrix (FEM) wafer.
Figure 7B:
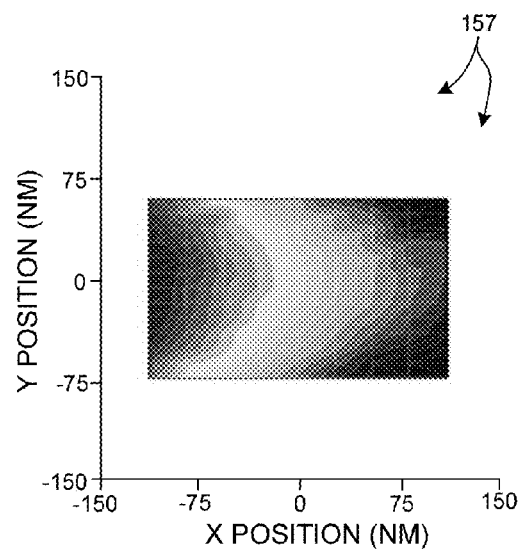

FIG. 7A is a contour plot 156 illustrative of measurements of middle critical dimension (MCD) of isolated structures across the surface of a focus exposure matrix (FEM) wafer. The exposure dosage varies in the x-direction across the wafer and the depth of focus varies in the y-direction across the wafer. As illustrated, the MCD values vary across the surface of the wafer due to differences in focus and exposure dosage across the surface of the wafer. FIG. 7B is a contour plot 157 illustrative of measurements of middle critical dimension (MCD) of dense structures across the surface of a focus exposure matrix (FEM) wafer. The exposure dosage varies in the x-direction across the wafer and the depth of focus varies in the y-direction across the wafer. As illustrated, the MCD values for dense structures also vary across the surface of the wafer due to differences in focus and exposure dosage across the surface of the wafer, but in a different manner than isolated structures.

The measurement results illustrated in FIGS. 7A and 7B result from measurements (i.e., measured spectra) collected at multiple measurement sites on the FEM wafer and processed in accordance with method 140 illustrated in FIG. 5. Both the underlying isolated MCD measurement model and the dense MCD measurement model were developed in accordance with method 120 and trained with measurement data collected from different measurement sites on the same FEM wafer.

Figure 8A:
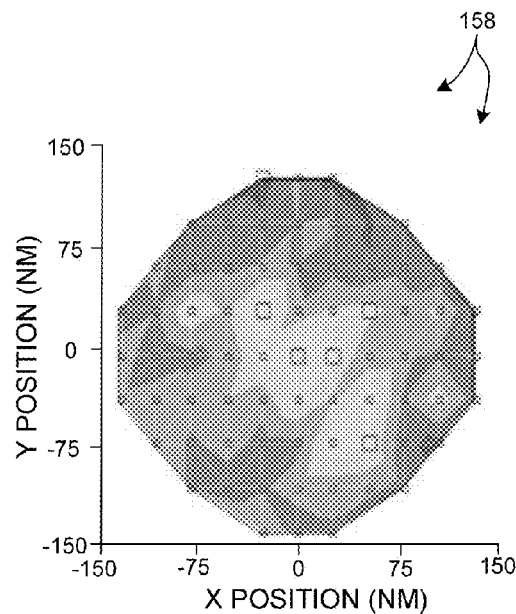
FIGS. 8A-8B are contour plots illustrative of measurements of middle critical dimension (MCD) of isolated structures and dense structures, respectively, across the surface of a sample wafer.
Figure 8B:
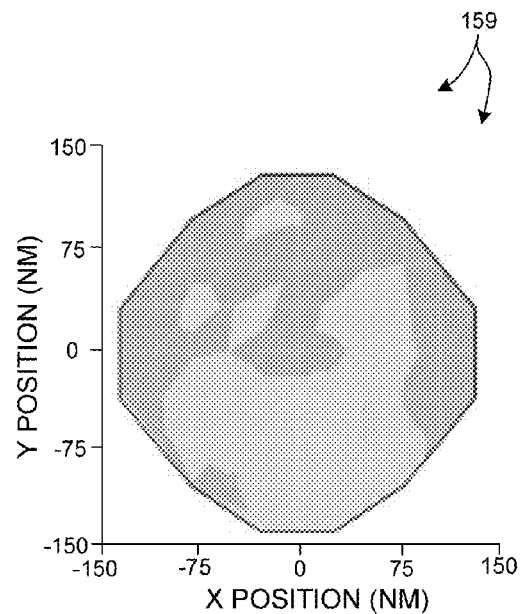

FIG. 8A is a contour plot 158 illustrative of measurements of MCD of isolated structures across the surface of a sample wafer. FIG. 8B is a contour plot 159 illustrative of measurements of MCD of dense structures across the surface of a sample wafer. The sample wafers were processed at a particular depth of focus and exposure dosage. The particular focus and dosage values correspond approximately with the focus and dosage values near the middle of the FEM wafer measured in FIGS. 7A-7B.

The measurement results illustrated in FIGS. 8A and 8B are derived from measurements (i.e., measured spectra) collected at multiple measurement sites on a sample wafer, different from the FEM wafer, and processed in accordance with method 140 illustrated in FIG. 5. Both the underlying isolated MCD measurement model and the dense MCD measurement model were developed in accordance with method 120 and trained with measurement data collected from different measurement sites on FEM wafer.

The measurement results illustrated in FIGS. 6A-6F, 7A-7B, and 8A-8B were derived from different measurement models, each corresponding to a particular process or structural parameter (e.g., focus, exposure, and MCD). However, in general, a measurement model may characterize more than one process parameter, structural parameter, or both.

FIG. 12 illustrates a system 300 for measuring characteristics of a specimen in accordance with the exemplary methods presented herein. As shown in FIG. 12, the system 300 may be used to perform spectroscopic ellipsometry measurements of one or more structures of a specimen 301. In this aspect, the system 300 may include a spectroscopic ellipsometer equipped with an illuminator 302 and a spectrometer 304. The illuminator 302 of the system 300 is configured to generate and direct illumination of a selected wavelength range (e.g., 150-850 nm) to the structure disposed on the surface of the specimen 301. In turn, the spectrometer 304 is configured to receive illumination reflected from the surface of the specimen 301. It is further noted that the light emerging from the illuminator 302 is polarized using a polarization state generator 307 to produce a polarized illumination beam 306. The radiation reflected by the structure disposed on the specimen 301 is passed through a polarization state analyzer 309 and to the spectrometer 304. The radiation received by the spectrometer 304 in the collection beam 308 is analyzed with regard to polarization state, allowing for spectral analysis by the spectrometer of radiation passed by the analyzer. These spectra 311 are passed to the computing system 330 for analysis of the structure.

As depicted in FIG. 12, system 300 includes a single measurement technology (i.e., SE). However, in general, system 300 may include any number of different measurement technologies. By way of non-limiting example, system 300 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, rather than one tool integrating multiple technologies.

In a further embodiment, system 300 may include one or more computing systems 330 employed to perform measurements based on measurement models developed in accordance with the methods described herein. The one or more computing systems 330 may be communicatively coupled to the spectrometer 304. In one aspect, the one or more computing systems 330 are configured to receive measurement data 311 associated with measurements of the structure of specimen 301.

It should be recognized that the various steps described throughout the present disclosure may be carried out by a single computer system 330 or, alternatively, a multiple computer system 330. Moreover, different subsystems of the system 300, such as the spectroscopic ellipsometer 304, may include a computer system suitable for carrying out at least a portion of the steps described herein. Therefore, the aforementioned description should not be interpreted as a limitation on the present invention but merely an illustration. Further, the one or more computing systems 330 may be configured to perform any other step(s) of any of the method embodiments described herein.

In addition, the computer system 330 may be communicatively coupled to the spectrometer 304 in any manner known in the art. For example, the one or more computing systems 330 may be coupled to computing systems associated with the spectrometer 304. In another example, the spectrometer 304 may be controlled directly by a single computer system coupled to computer system 330.

The computer system 330 of the metrology system 300 may be configured to receive and/or acquire data or information from the subsystems of the system (e.g., spectrometer 304 and the like) by a transmission medium that may include wireline and/or wireless portions. In this manner, the transmission medium may serve as a data link between the computer system 330 and other subsystems of the system 300.

Computer system 330 of the integrated metrology system 300 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 330 and other systems (e.g., memory on-board metrology system 300, external memory, reference measurement source 320, or other external systems). For example, the computing system 330 may be configured to receive measurement data from a storage medium (i.e., memory 332 or an external memory) via a data link. For instance, spectral results obtained using spectrometer 304 may be stored in a permanent or semi-permanent memory device (e.g., memory 332 or an external memory). In this regard, the spectral results may be imported from on-board memory or from an external memory system. Moreover, the computer system 330 may send data to other systems via a transmission medium. For instance, an integrated measurement model or a specimen parameter 340 determined by computer system 330 may be communicated and stored in an external memory. In this regard, measurement results may be exported to another system.

Computing system 330 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 334 implementing methods such as those described herein may be transmitted over a transmission medium such as a wire, cable, or wireless transmission link. For example, as illustrated in FIG. 12, program instructions 334 stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

In a further aspect, measurement data from multiple targets is collected for model building, training, and measurement. In some examples, the use of measurement data associated with multiple targets eliminates, or significantly reduces, the effect of under layers in the measurement result. In one example, measurement signals from two targets are subtracted to eliminate, or significantly reduce, the effect of under layers in each measurement result. The use of measurement data associated with multiple targets increases the sample and process information embedded in the model. In particular, the use of training data that includes measurements of multiple, different targets at one or more measurement sites enables more accurate measurements.

In one example, a measurement model is created from spectral measurements of a FEM wafer for both isolated and dense targets. The measurement model is then trained based on the spectral measurement data and an expected response model for focus, exposure, MCD for an isolated target, and MCD for a dense target, respectively. The resulting trained measurement models are subsequently employed to calculate focus, exposure, and MCD for both isolated and dense targets on sample wafers. In this manner, each parameter has its own trained model that calculates the parameter value from the measured spectra (or extracted features) associated with both isolated and dense targets.

FIGS. 9A-9B and 10A-10B illustrate measurement results for focus and exposure for FEM and CDU wafers with under layer gratings.

Figures 9A, 9B:
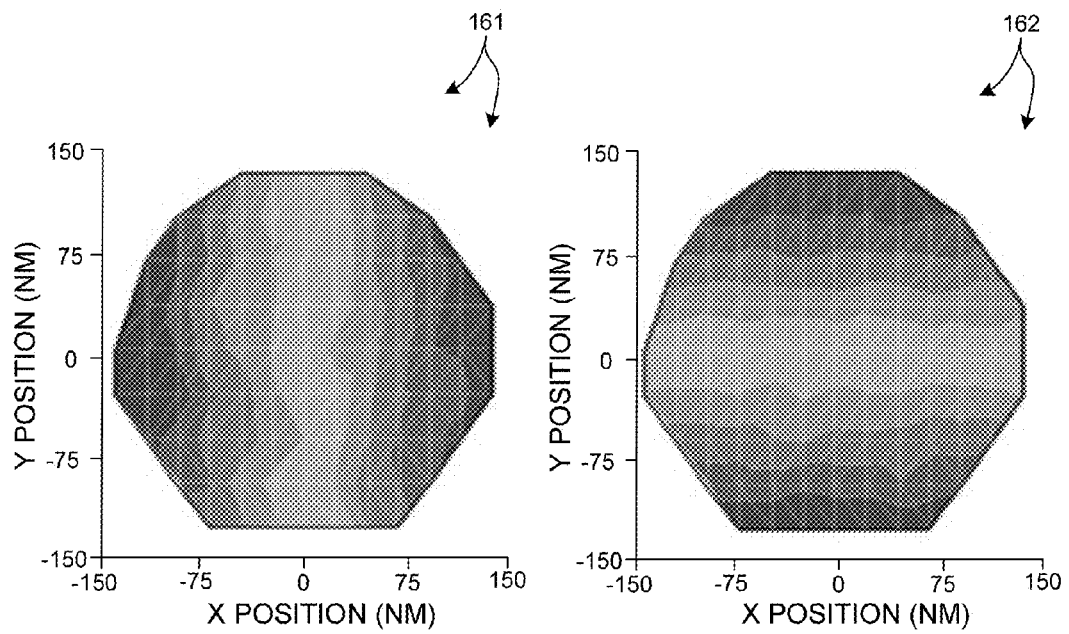
FIGS. 9A-9B are contour plots illustrative of measurements of depth of focus and exposure dosage, respectively, across the surface of a FEM wafer.

FIG. 9A is a contour plot 161 illustrative of measurements of depth of focus across the surface of a FEM wafer. In this example, focus varies in the x-direction across the wafer and is constant in the y-direction across the wafer. FIG. 9B is a contour plot 162 illustrative of measurements of exposure dosage across the surface of the FEM wafer. As illustrated, dosage varies in the y-direction across the wafer and is constant in the x-direction across the wafer.

The measurement results illustrated in FIGS. 9A and 9B result from measurements (i.e., measured spectra) collected at multiple measurement sites on the FEM wafer and processed in accordance with method 140 illustrated in FIG. 5. The underlying dosage and focus measurement models were developed in accordance with method 110 and trained with measurement data collected from different measurement sites on the same DOE wafer.

Figures 10A, 10B:
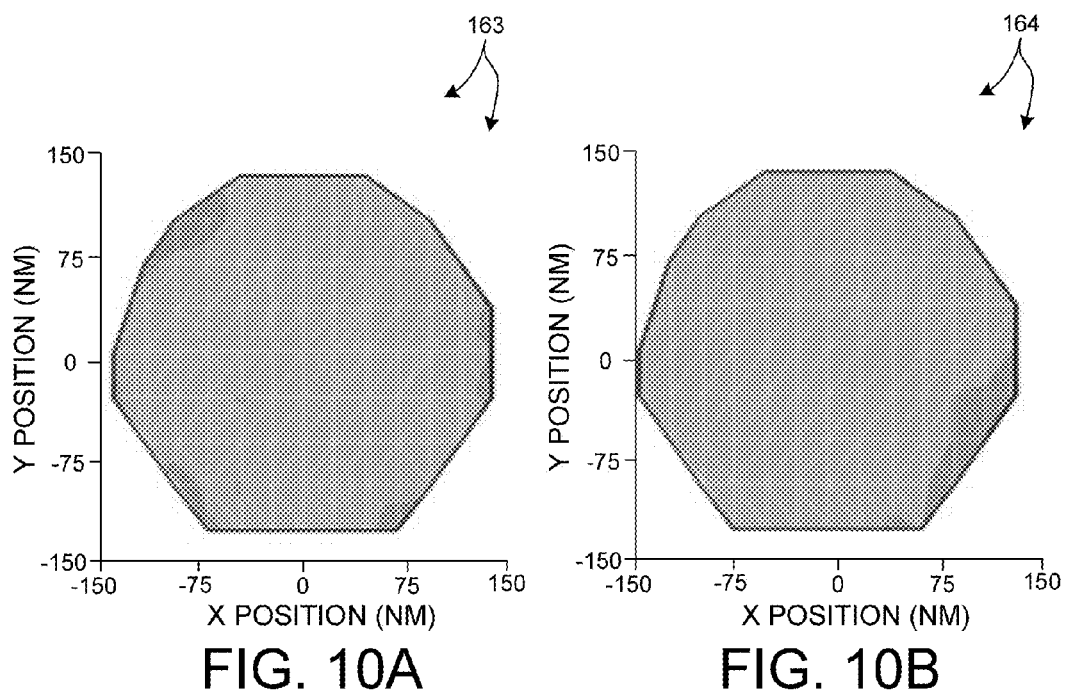
FIGS. 10A-10B are contour plots illustrative of measurements of depth of focus and exposure dosage, respectively, across the surface of a sample wafer.

FIG. 10A is a contour plot 163 illustrative of measurements of depth of focus across the surface of a sample wafer. FIG. 10B is a contour plot 164 illustrative of measurements of exposure dosage across the surface of the same wafer described with reference to FIG. 10A. The sample wafers were processed at a particular depth of focus and exposure dosage. The particular focus and dosage values correspond approximately with the focus and dosage values near the middle of the FEM wafer measured in FIGS. 9A-9B. As a result, it is expected that the focus and exposure measurement results illustrated in FIGS. 10A-10B, respectively, show minimal variation in focus and exposure over the wafer surface.

The measurement results illustrated in FIGS. 10A and 10B are derived from measurements (i.e., measured spectra) collected at multiple measurement sites on a wafer, different from the FEM wafer, and processed in accordance with method 140 illustrated in FIG. 5. The underlying dosage and focus measurement models were developed in accordance with method 110 and trained with measurement data collected from different measurement sites on the DOE wafer described with reference to FIGS. 9A and 9B.

Figure 11:
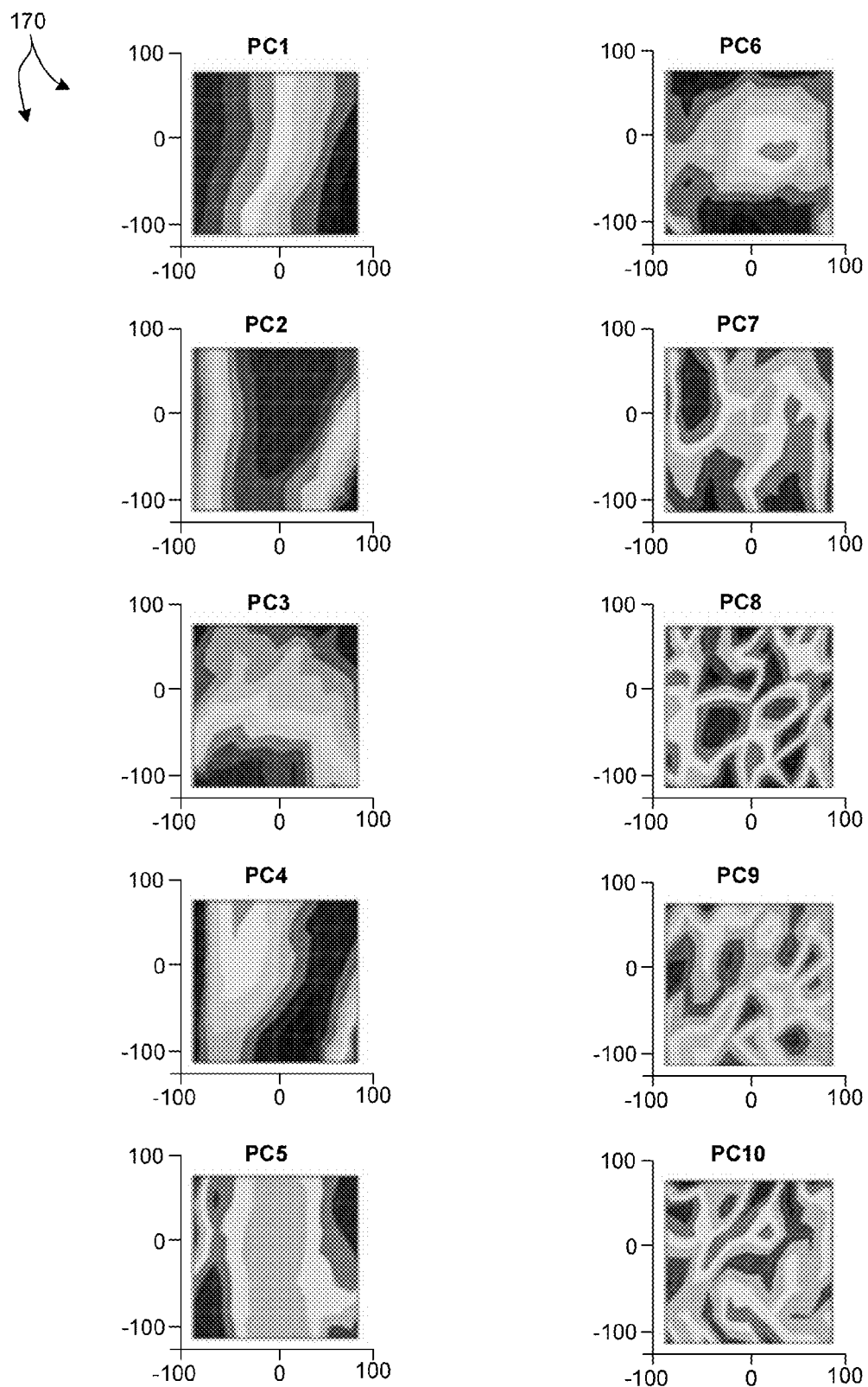
FIG. 11 is a diagram illustrative of a matrix 170 of principal components maps of spectra collected from a FEM wafer.

FIG. 11 illustrates a matrix 170 of principal components maps of spectra collected from a FEM wafer. As illustrated, the first few principal components roughly reflect the global focus and exposure patterns created by the Focus and Exposure Matrix (i.e., variation in one direction, constant in the orthogonal direction, and vice-versa). Principal component maps higher than seven exhibit a noisy pattern associated with random under layer variations, line edge roughness, or other types of noise. In this example, it is preferred to utilize only the first seven principal components to train the focus and exposure models. In this manner, principal components that primarily reflect noise are truncated for purposes of model building, and subsequent measurement analysis.

In another further aspect, measurement data from both on-device measurement targets and assist targets that may be found on-device or within scribe lines is collected for model building, training, and measurement.

In one example, focus metrology is performed by acquiring measurement data of either a device structure or dedicated metrology target located on-device and additional focus assist targets located on-device or within the scribe lines. Focus assist targets may have specially designed structures that print differently at the same focus. In some examples, one can design targets that print the same profiles but at different focus offsets. Additional details are described in U.S. patent application Ser. No. 14/074,412, by Levinsky et al., and assigned to KLA-Tencor Corporation, Milpitas, Calif., the entirety of which is incorporated herein by reference. This multi-target methodology enables on-device measurements of focus. A similar methodology can be applied to dose metrology.

In other examples, measurements of assist targets along with on-device targets may be employed to perform CD measurements in litho or etch use cases, and composition measurements. Assist targets located in the scribe lines may be optimized to provide a calibration reference for on-device measurements. In some examples, assist targets have CD parameter offsets or composition parameter offsets (e.g., on-device implanted area can be left unimplanted in the assist target). The measurement data acquired from these targets is combined in a multi-target analysis as described hereinbefore to enable on-device measurements.

In another further aspect, measurement data derived from measurements performed by a combination of multiple, different measurement techniques is collected for model building, training, and measurement. The use of measurement data associated with multiple, different measurement techniques increases the sample and process information embedded in the model and enables more accurate measurements. Measurement data may be derived from measurements performed by any combination of multiple, different measurement techniques. In this manner, different measurement sites may be measured by multiple, different measurement techniques to enhance the measurement information available for characterization of the semiconductor structures.

In general, any measurement technique, or combination of two or more measurement techniques may be contemplated within the scope of this patent document. Exemplary measurement techniques include, but are not limited to spectroscopic ellipsometry, including Mueller matrix ellipsometry, spectroscopic reflectometry, spectroscopic scatterometry, scatterometry overlay, beam profile reflectometry, both angle-resolved and polarization-resolved, beam profile ellipsometry, single or multiple discrete wavelength ellipsometry, transmission small angle x-ray scatterometer (TSAXS), small angle x-ray scattering (SAXS), grazing incidence small angle x-ray scattering (GISAXS), wide angle x-ray scattering (WAXS), x-ray reflectivity (XRR), x-ray diffraction (XRD), grazing incidence x-ray diffraction (GIXRD), high resolution x-ray diffraction (HRXRD), x-ray photoelectron spectroscopy (XPS), x-ray fluorescence (XRF), grazing incidence x-ray fluorescence (GIXRF), low-energy electron induced x-ray emission scatterometry (LEXES), x-ray tomography, and x-ray ellipsometry. In general, any metrology technique applicable to the characterization of semiconductor structures, including image based metrology techniques, may be contemplated. Additional sensor options include electrical sensors such as non-contact capacitance/voltage or current/voltage sensors which bias the device and detect the resulting bias with an optical sensor (or the converse), or assisted optical techniques, such as XRD, XRF, XPS, LEXES, SAXS, and pump probe techniques. In one embodiment a two-dimensional beam profile reflectometer (pupil imager) may be used to collect both angle resolved and/or multi-spectral data in a small spot size. A UV Linnik interferometer may also be used as a Mueller matrix spectral pupil imager.

In some examples, the model building, training, and measurement methods described herein are implemented as an element of a SpectraShape® optical critical-dimension metrology system available from KLA-Tencor Corporation, Milpitas, Calif., USA. In this manner, the model is created and ready for use immediately after the DOE wafer spectra are collected by the system.

In some other examples, the model building and training methods described herein are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

Although several examples are described hereinbefore with reference to a lithography process model and associated focus and exposure metrologies, the methods and systems described herein may involve other process models (e.g., etch or deposition processing), and other metrologies (e.g., etch and deposition metrologies). The methods and systems described herein may also involve other reference metrology technologies (e.g. SEM, TEM, AFM, X-ray). Moreover, the methods and systems described herein are discussed with reference to optical metrology systems (e.g., spectroscopic ellipsometers, reflectometers, BPR systems, etc.), but can be also applied to other model-based metrologies (e.g., overlay, CD-SAXS, XRR, etc.).

In another example, the methods and systems of on-device metrology described herein may be applied to overlay metrology. On-device metrology is particularly relevant to the measurement of overlay. The objective of overlay metrology is to determine shifts between different lithographic exposure steps. However, performing overlay metrology on-device is difficult due to the small size of on-device structures, and the typically small overlay value.

For example, the pitch of typical scribe line overlay metrology structures varies from 200 nanometers to 2,000 nanometers. But, the pitch of on-device, overlay metrology structures is typically 100 nanometers or less. In addition, in a nominal production environment, the device overlay is only a small fraction of the periodicity of the device structure. In contrast, proxy metrology structures used in scatterometry overlay are frequently offset at larger values, e.g., quarter of the pitch, to enhance signal sensitivity to overlay.

Under these conditions, on-device, overlay metrology is performed with sensor architectures having sufficient sensitivity to small offset, small pitch overlay. In some examples, Deep Ultraviolet Beam Profile Reflectometry (DUV BPR) operating in Mueller matrix, and polarization modes, X-ray Mueller Spectroscopic Ellipsometry (XMSE), metrology at Wood's anomaly, and multi discrete angle Mueller matrix spectrometer architectures may be employed to obtain a measurement signal sensitive to overlay on-device. In another example, the entire chip may be measured at once by multiplexing. Deformities may be detected with a Linnik interferometer employing a tiltable reference mirror. These sensor architectures may be suitable for measurement of periodic targets, but also may be suitable for measurement of non-periodic targets.

After acquisition, the measured signals are analyzed to determine overlay error based on variations in the measured signals. In one further aspect, the spectral or angle-resolved data is analyzed using PCA, and an overlay model is trained to determined overlay based on the principal components detected in the measured signal. In one example, the overlay model is a neural network model. In this sense, the overlay model is not a parametric model, and thus is not prone to errors introduced by inaccurate modeling assumptions. As described hereinbefore, the training of the overlay metrology model based on measurements of dedicated metrology structures which are nominally identical to the device features but with larger offsets can help to overcome the sensitivity problem. These offsets can be introduced by fixed design offsets introduced between features in the two layers to be measured during reticle design. The offsets can also be introduced by shifts in the lithography exposure. The overlay error may be extracted more efficiently from the compressed signal (e.g., PCA signal) by using multiple, shifted targets (e.g., pitch/4 and –pitch/4) and the effect of the underlayer may also be reduced.

Figure 13A:
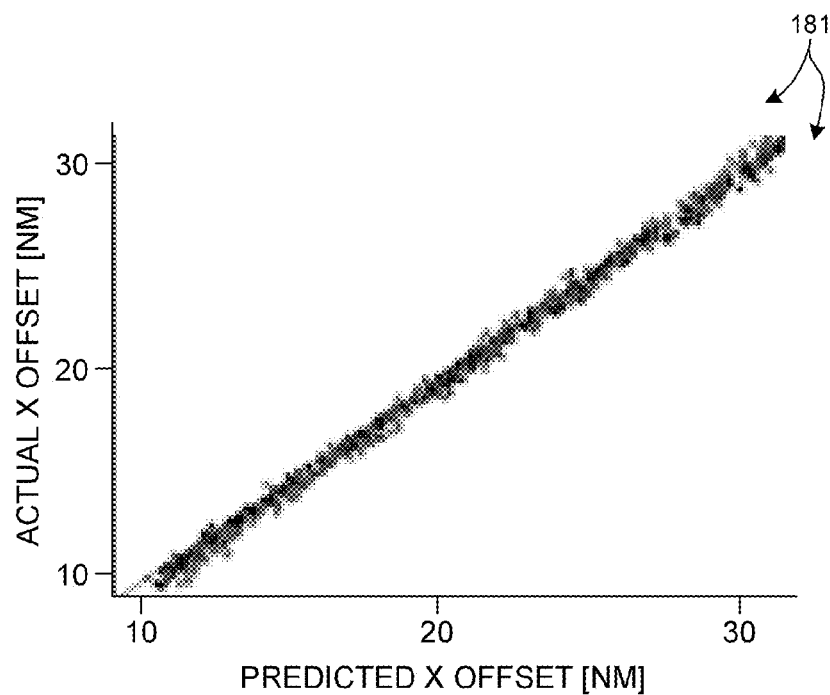
FIGS. 13A-13B are plots illustrative of measurements of the X and Y offset of a post overlay, respectively.
Figure 13B:
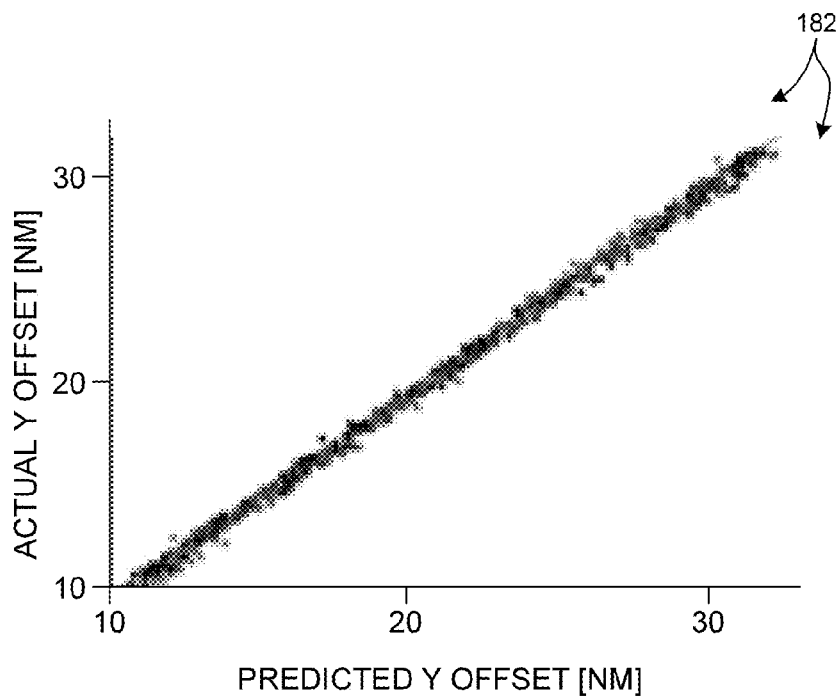

FIGS. 13A-13B illustrate plots 181 and 182 demonstrating the results of measuring the X and Y offset of a post overlay, respectively. DOE spectra were generated synthetically for different X and Y offsets in the presence of other geometric parameters variations. FIG. 13A illustrates the model fit of predicted x offset value in nanometers to the actual x offset value used to generate the synthetic spectra. Similarly, FIG. 13B illustrates the model fit of predicted y offset value in nanometers to the actual y offset value used to generate the synthetic spectra. As illustrated, the residual errors are less than one nanometer in magnitude.

In another embodiment, several measurements are performed in areas sufficiently close that it is reasonable to assume that the overlay is constant at all sites. This fact is then used to do on the fly calibration of the on-device overlay measurement. In addition, a comparison of geometry from images of the pattern (i.e., images acquired by an imaging sensor), EDA, or mask data may be used to find anomalies.

In yet another example, the methods and systems of on-device metrology described herein may be applied to on-device metrology navigation. On-device measurement data must be acquired from the desired measurement site to be useful. In other words, the illumination beam must be accurately positioned relative to the device structure to acquire meaningful measurement data.

In some embodiments, a mask design file, e.g., a Graphic Database System (GDS) file, can be used as navigational guide into the device area using reference marks recognized by the pattern recognition system incorporated into the metrology tool. However, GDS data represents ideal structures with ideal placement on a wafer surface. The actual structures and their placement on a printed wafer will be different.

Figure 14:
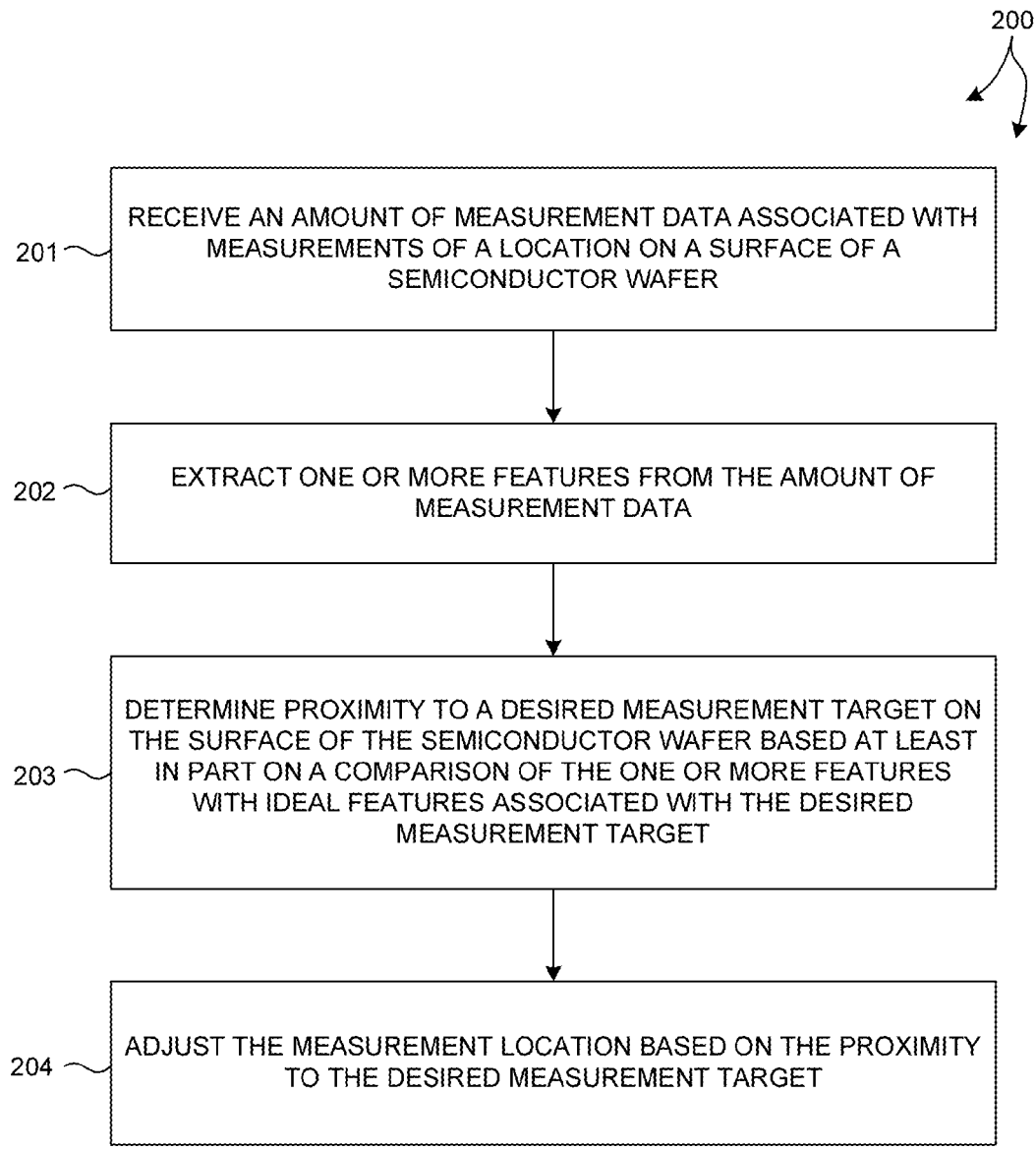
FIG. 14 is a flowchart illustrative of a method 200 of navigating to a desired measurement target.

In yet another aspect, measurement data is collected and analyzed in the manner described herein to determine the location of a desired metrology target on a wafer surface. FIG. 14 illustrates a method 200 suitable for implementation by a metrology system such as metrology system 300 illustrated in FIG. 12 of the present invention. In one aspect, it is recognized that data processing blocks of method 200 may be carried out via a pre-programmed algorithm executed by one or more processors of computing system 330, or any other general purpose computing system. It is recognized herein that the particular structural aspects of metrology system 300 do not represent limitations and should be interpreted as illustrative only.

In block 201, an amount of measurement data associated with measurements of a location on a surface of a semiconductor wafer are received.

In block 202, one or more features are extracted from the amount of measurement data. In some examples, the measurement data is analyzed using Principal Components Analysis (PCA), or non-linear PCA, to extract features that most strongly reflect the features of the structure expected to be located at the measurement location.

In block 203, the proximity of the measured location to a desired measurement target on the surface of the semiconductor wafer is determined based at least in part on a comparison of the one or more features with ideal features associated with the desired measurement target.

In block 204, the measurement location is adjusted based on the determined proximity to the desired measurement target. This method may be performed iteratively to progressively move closer to the desired measurement site.

In some other examples, proximity to the desired measurement target is determined based on changes in the measured features. In one example, the desired measurement target is surrounded by dummy structures of a specific spatial frequency. The metrology spot traverses the dummy structures to arrive at the desired measurement target. The presence of a specific diffraction order in a specific pupil location would indicate that the metrology spot is on the dummy structures. However, the absence of the specific diffraction order in the specific pupil location indicates arrival on the measurement site.

As described hereinbefore, non-periodic underlayer structures combined with periodic upper structures enhance measurement sensitivity to the upper layer. Hence, in some examples, navigation based on features extracted from collected measurement data is preferred in regions of the wafer where non-periodic underlayer structures are combined with a periodic upper layer.

In yet another further aspect, short wavelength components of the illumination beam are employed to highlight whether a structure is periodic based on the response of the structure to short wavelength illumination. Sufficiently short illumination wavelengths enable the capture of first order diffraction elements that would otherwise be evanescent.

In yet another aspect, an analysis of a pupil image of a measurement system (e.g., a 2D-BPR system) is performed to determine whether a structure is periodic or non-periodic. In one example, an analysis of the zero order symmetry of the pupil image is employed to determine whether the structure is periodic or non-periodic. In another example, features extracted from collected measurement data using PCA analysis, may be employed to determine whether the structure is periodic or non-periodic. In particular, higher order components of the PCA analysis are particularly useful to determine whether the structure is periodic or non-periodic.

In some examples, multiple measurements are performed across a Static Random Access Memory (SRAM) structure to reduce radiation loading on the device while improving signal to noise.

In some other examples, the spot size or angle of incidence are varied in and out of a line end structure. In some examples, control of the spot size or location is achieved using spatial light modulators, variable apodizers, or a beam scanner.

In some other examples, a Fourier analysis of a large spot size signal can also be performed.

In some embodiments, a metrology tool employs an imaging sensor and a scatterometry sensor having a known spatial offset between the two sensors. In some examples, the measurement location of the scatterometry sensor is determined based on imaging sensing results and the known, spatial offset between the sensors.

In some embodiments, a CD-SEM subsystem and 2D BPR sub-system are combined. The CD-SEM is able to resolve design rule features directly, and thus is used as a navigational guide for the high throughput 2D-BPR metrology system.

In some examples, collected spectral data is analyzed in real-time using a model trained to identify a response consistent with the device structure probed by the measurement beam. The results of the analysis are used to navigate into the device area.

In yet another aspect, the measurement model results described herein can be used to provide active feedback to a process tool (e.g., lithography tool, etch tool, deposition tool, etc.). For example, values of the depth and focus parameters determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

In general, the systems and methods described herein can be implemented as part of the process of preparing a measurement model for off-line or on-tool measurement. In addition, both measurement models and any reparameterized measurement model may describe one or more target structures and measurement sites.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
    providing illumination light to a plurality of measurement sites on a surface of a semiconductor wafer with known variations of at least one process parameter, structure parameter, or both, wherein at least one of the first plurality of sites includes a device structure;
    detecting an amount of light from each of the plurality of measurement sites in response to the illumination light;
    generating a measured response associated with each of the plurality of measurement sites based on the detected amounts of light, the measured response associated with each of the plurality of measurement sites comprising a first amount of measurement data;
    determining an expected response model of each of the at least one known process parameters, structure parameters, or both, each expected response model defining values of the parameter as a function of location on the surface of the semiconductor wafer;
    determining an input-output measurement model based at least in part on the first amount of measurement data; and
    training the input-output measurement model based on parameter values determined from the expected response model;
    receiving a second amount of measurement data associated with measurements of a location on a surface of the semiconductor wafer or another semiconductor wafer;
    extracting one or more features from the second amount of measurement data;
    determining proximity to a desired measurement target on the surface of the measured semiconductor wafer based at least in part on a comparison of the one or more features with ideal features associated with the desired measurement target;
    adjusting the measurement location based on the proximity to the desired measurement target;
    receiving a third amount of measurement data associated with measurements of a second plurality of sites on the surface of the measured semiconductor wafer, wherein at least one of the second plurality of sites includes the device structure;
    determining at least one process parameter value, at least one structural parameter value, or both, associated with each of the second plurality of sites based on a fitting of the third amount of measurement data to the trained input-output measurement model; and
    storing any of the at least one process parameter value, the at least one structural parameter value, or both, in a memory.

2. The method of claim 1, wherein the first amount of measurement data is associated with measurements of a first plurality of sites with known variations of any of focus, exposure dosage, overlay, and critical dimension over the surface of the semiconductor wafer.

3. The method of claim 1, further comprising:
    extracting one or more features of the first amount of measurement data by reducing a dimension of the first amount of measurement data, and wherein the determining the input-output measurement model is based at least in part on the one or more features.

4. The method of claim 3, wherein the reducing the dimension of the first amount of measurement data involves any of a principal components analysis, a non-linear principal components analysis, a selection of individual signals from the first amount of measurement data, and a filtering of the first amount of measurement data.

5. The method of claim 1, wherein the expected response model is a wafer map model, and wherein the determining the wafer map model involves fitting a two dimensional map function to the known process parameters, structure parameters, or both, associated with the first plurality of sites.

6. The method of claim 1, wherein the device structure is a dedicated on-device metrology structure.

7. The method of claim 6, wherein at least one of the first plurality of sites includes an assist structure located in a scribe line of the semiconductor wafer.

8. A system comprising:
    an illuminator configured to provide illumination light to a plurality of measurement sites on a surface of a semiconductor wafer with known variations of at least one process parameter, structure parameter, or both, wherein at least one of the first plurality of sites includes a device structure;
    a detector configured to detect an amount of light from each of the plurality of measurement sites in response to the illumination light and generate a measured response associated with each of the plurality of measurement sites based on the detected amounts of light, the measured response associated with each of the plurality of measurement sites comprising a first amount of measurement data; and
    a computing system configured to:
        determine an expected response model of each of the at least one known process parameters, structure parameters, or both, each expected response model defining values of the parameter as a function of location on the surface of the semiconductor wafer;
        determine an input-output measurement model based at least in part on the first amount of measurement data; and
        train the input-output measurement model based on parameter values determined from the expected response model;
        receive a second amount of measurement data associated with measurements of a second plurality of sites on a surface of the semiconductor wafer or another semiconductor wafer;
        adjust a measurement location on the measured semiconductor wafer based on a proximity to a desired measurement target at one or more of the second plurality of sites;
        determine at least one process parameter value, at least one structural parameter value, or both, associated with each of the second plurality of sites based on a fitting of the second amount of measurement data to the trained input-output measurement model; and store any of the at least one process parameter value, the at least one structural parameter value, or both, in a memory.

9. The system of claim 8, wherein the computing system is further configured to:

extract one or more features of the first amount of measurement data by reducing a dimension of the first amount of measurement data, and wherein the determining the input-output measurement model is based at least in part on the one or more features.

10. The system of claim 9, wherein the reducing the dimension of the first amount of measurement data involves any of a principal components analysis, a non-linear principal components analysis, a selection of individual signals from the first amount of measurement data, and a filtering of the first amount of measurement data.

11. The system of claim 8, wherein the device structure is a dedicated on-device metrology structure.

12. The system of claim 11, wherein at least one of the first plurality of sites includes an assist structure located in a scribe line of the semiconductor wafer.

13. The system of claim 8, wherein the adjusting of the measurement location is based at least in part on one or more features extracted from the second amount of measurement data.

14. A method comprising:

providing illumination light at a measurement location to a measurement site on a surface of a first semiconductor wafer wherein the measurement site includes a device structure;

detecting an amount of light from the measurement site in response to the illumination light;

generating a measured response associated with the measurement site based on the detected amounts of light, the measured response comprising a first amount of measurement data;

extracting one or more features from the first amount of measurement data by a computing system, wherein the extracting of the one or more features from the first amount of measurement data involves a principal component analysis;

determining proximity to a desired measurement target on the surface of the semiconductor wafer by a computer system based at least in part on a comparison of the one or more features with ideal features associated with the desired measurement target; and adjusting the measurement location based on the proximity to the desired measurement target.

15. The method of claim 14, further comprising:

receiving a second amount of measurement data associated with measurements of a desired measurement target on the semiconductor wafer;

determining at least one process parameter value, at least one structural parameter value, or both, based on a fitting of the second amount of measurement data to a trained input-output measurement model; and storing any of the at least one process parameter value, the at least one structural parameter value, or both, in a memory.

16. The method of claim 14, wherein the desired measurement target is an on-device structure.

* * * * *